(12) United States Patent
Kobayashi et al.

(10) Patent No.: US 6,568,996 B2
(45) Date of Patent: May 27, 2003

(54) POLISHING AGENT FOR PROCESSING SEMICONDUCTOR, DISPERSANT USED THEREFOR AND PROCESS FOR PREPARING SEMICONDUCTOR DEVICE USING ABOVE POLISHING AGENT FOR PROCESSING SEMICONDUCTOR

(75) Inventors: Toshio Kobayashi, Tokyo (JP); Toshiyuki Toyoshima, Tokyo (JP); Suguru Nagae, Tokyo (JP); Masanobu Iwasaki, Tokyo (JP); Kouichirou Tsutahara, Tokyo (JP); Shin Hasegawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 83 days.

(21) Appl. No.: 09/837,323

(22) Filed: Apr. 19, 2001

(65) Prior Publication Data

US 2002/0039875 A1 Apr. 4, 2002

(30) Foreign Application Priority Data

Oct. 2, 2000 (JP) ........................................ 2000-301965

(51) Int. Cl.$^7$ ................................................. C09K 3/14
(52) U.S. Cl. ............................ 451/36; 438/692; 51/301
(58) Field of Search ............................ 451/36, 37, 28; 438/633, 692, 693, 906; 51/301

(56) References Cited

U.S. PATENT DOCUMENTS

| 4,959,347 A | | 9/1990 | Kobayashi et al. |
| 5,004,720 A | | 4/1991 | Kobayashi et al. |
| 5,175,279 A | * | 12/1992 | Kurane et al. ................. 435/41 |
| 5,304,533 A | | 4/1994 | Kobayashi et al. |
| 5,347,008 A | * | 9/1994 | Bentley et al. ............. 548/170 |
| 5,607,718 A | * | 3/1997 | Sasaki et al. .................. 134/2 |
| 5,662,769 A | * | 9/1997 | Schonauer et al. ............ 134/2 |
| 5,775,980 A | * | 7/1998 | Sasaki et al. ............... 451/285 |

FOREIGN PATENT DOCUMENTS

| JP | 09109020 A | * | 4/1997 | ........... B24B/37/00 |
| JP | 2000-017195 | | 1/2000 | |
| JP | 2000038575 A | * | 2/2000 | ........... B24B/57/02 |
| JP | 2001007062 A | * | 1/2001 | ........... B24B/37/00 |
| JP | 2001031951 A | * | 2/2001 | ............. C09C/1/68 |
| JP | 2002110596 A | * | 4/2002 | ........... B01F/17/42 |

* cited by examiner

Primary Examiner—Joseph J. Hail, III
Assistant Examiner—David B. Thomas
(74) Attorney, Agent, or Firm—Oblon, Spivak, McClelland, Maier & Neustadt, P.C.

(57) ABSTRACT

The object of the present invention is to provide a polishing agent for processing semiconductor, which can control coagulation and sedimentation and has stable and re-productive polishing properties under a proper dispersing condition to prevent generation of polishing flaw. The polishing agent for processing semiconductor comprises a compound having glucose structure, polishing particles and water.

8 Claims, 2 Drawing Sheets

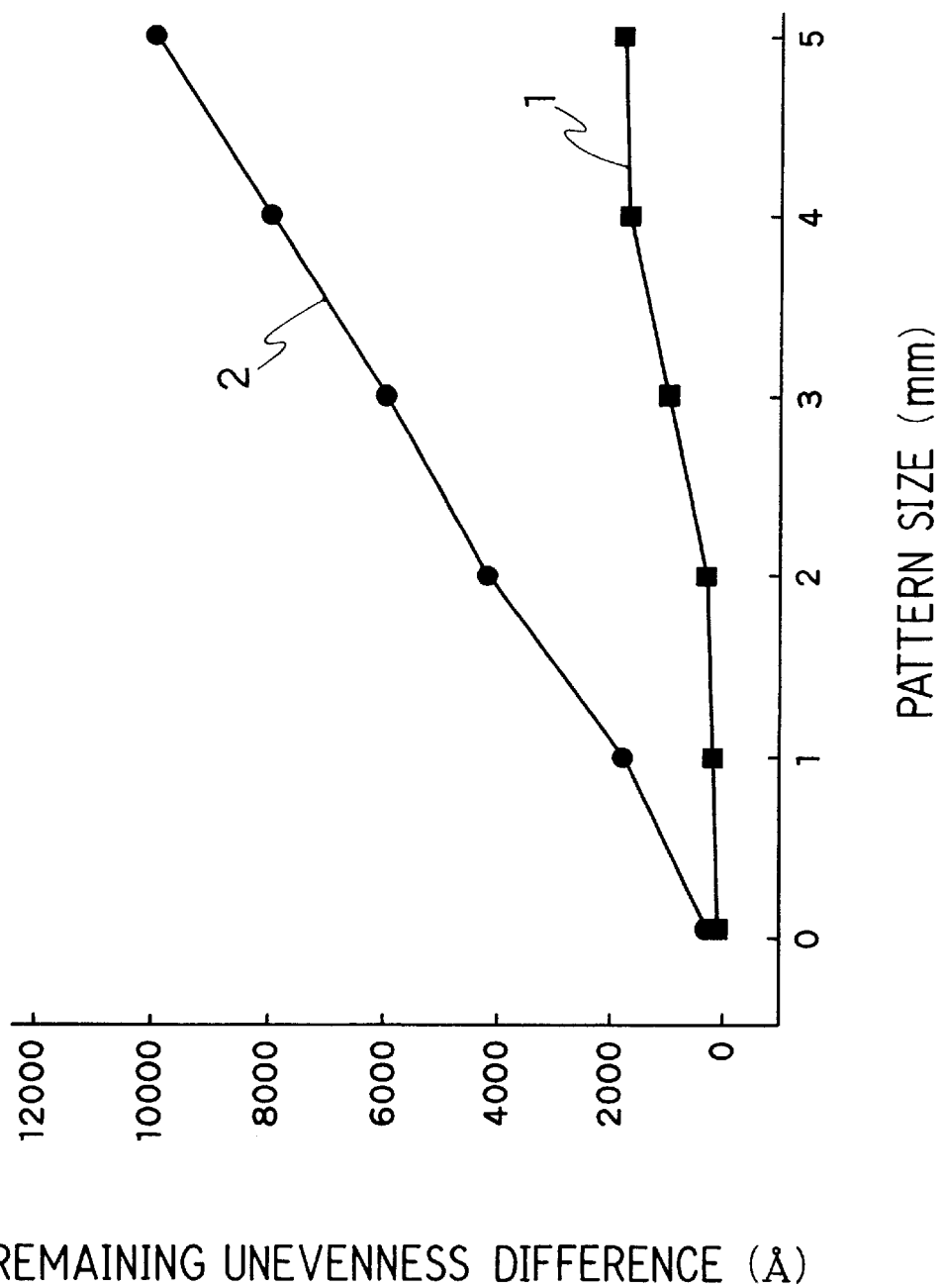

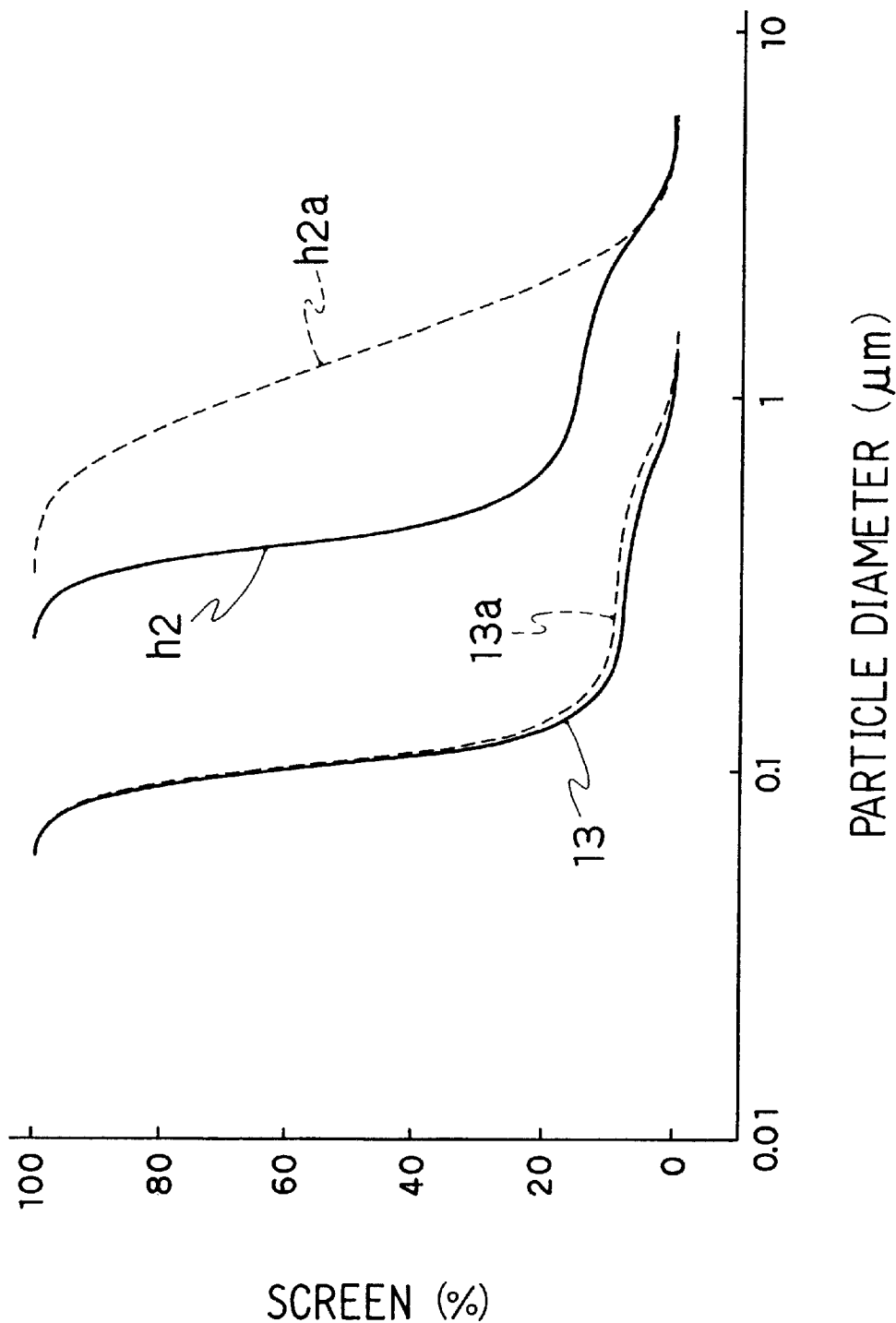

POLISHING AGENT FOR PROCESSING SEMICONDUCTOR, DISPERSANT USED THEREFOR AND PROCESS FOR PREPARING SEMICONDUCTOR DEVICE USING ABOVE POLISHING AGENT FOR PROCESSING SEMICONDUCTOR

BACKGROUND OF THE INVENTION

The present invention relates to a polishing agent for processing semiconductor, a dispersant used therefor, and a process for preparing a semiconductor device using the above polishing agent for processing the semiconductor.

In accordance with advance in high-performance and multi-layering for semiconductor devices, flattening technology for uneven plane form became inevitable. It has promoted technological development for the flattening of an $SiO_2$ insulating film, a metal film such as Al, W, Cu, Ru or Ta, and a conductive film such as poly-Si, which are formed by means of plasma CVD, constant pressure CVD, thermal oxidation and the like. And there has been developed a polishing agent, a polishing device and a process employed therefor.

Generally, a polishing device comprises a mechanism that a polishing board laminated with a polishing pat and a polishing substrate are supported and the rotating substrate is pressed to the polishing pat, and a mechanism that a polishing agent is supplied.

As to polishing agent supply, various supplying methods are known. For example, by using a polishing particle nozzle, a dispersant nozzle and a pure water nozzle, the polishing particles are supplied with the water through the polishing particle nozzle, while the dispersant is supplied with the water through the dispersant nozzle. Also, all elements can be previously prepared to supply the prepared polishing agent from a single nozzle.

This is because the most suitable mixing ratios among the polishing particles, the dispersant and the pure water vary depending on the processed material, and because it is aimed to polish by flexibly varying the mixing ratio depending on the kinds of the processed material.

As to the polishing agent, there is generally used a silica polishing agent, a ceria polishing agent and an alumina polishing agent.

The silica polishing agent is produced by dispersing fumed or colloidal silica in water and by suitably arranging pH thereof with KOH, ammonium and the like. The ceria polishing agent is prepared by dispersing polishing particle of ceria in water, while the alumina polishing agent is prepared by dispersing alumina in water.

In general, a polishing agent contains a dispersant. For example, Japanese Unexamined Patent Publication No. 17195/2000 discloses that ammonium salt of polyacrylate is used as a dispersant.

However, since the above conventional polishing agent includes the above dispersant, there have been problems that the dispersion is unsatisfactory, the polishing particles are coagulated and easily sedimentated to generate polishing flaw, and thereby stability and re-productivity cannot be achieved in polishing.

SUMMARY OF THE INVENTION

The present invention is carried out in order to solve these problems. The object of the present invention is to provide a polishing agent for processing semiconductor which can control coagulation and sedimentation and has stable and re-productive polishing properties under a proper dispersing condition to prevent generation of polishing flaw; a dispersant used therefor; and a process for preparing a semiconductor device using the same.

The first dispersant used for a polishing agent for processing semiconductor of the present invention comprises a dispersant component comprising a compound having glucose structure, and water.

The second dispersant used for a polishing agent for processing semiconductor of the present invention comprises a dispersant component and water, wherein the polishing dispersant component is at least one selected from the group consisting of gelatin, taragum, cationic guar gum, collagen, dextrin, tragacanth, propylene glycol alginate, cyclodextrin, chitin, hyaluronic acid, carmelose, starch, cyprogum, bee gum, pullulan, laponite, pectin, bentonite, trehalose, casein, saccharose, maltose, fructose, mannose, glucuronic acid, glucosamine, glucosan, cationic cellulose, glucosidase, glucose phenylosazone, hydroxyethylcellulose, chitosan, starch phosphate, soybean lecithin, xanthan gum, tamalind gum, locust bean gum, tamalindsy gum, Arabic gum, cyliumseed gum, caragynan, gelan gum, guar gum and polyglycerol fatty acid ester.

The first polishing agent for processing semiconductor of the present invention comprises the above first dispersant and polishing particles.

The second polishing agent for processing semiconductor of the present invention comprises the above second dispersant and polishing particles.

The third polishing agent for processing semiconductor of the present invention is that in the above first polishing agent, the polishing particles is at least one selected from the group consisting of cerium oxide, silica, silica sol and alumina, whose particle size of the primary particles is at most 1 $\mu$m.

The fourth polishing agent for processing semiconductor of the present invention is that in the above second polishing agent, the polishing particles is at least one selected from the group consisting of cerium oxide, silica, silica sol and alumina, whose particle size of the primary particles is at most 1 $\mu$m.

The fifth polishing agent for processing semiconductor of the present invention comprises a first solution prepared by dispersing polishing particles in water and a second solution of the above first dispersant used for the polishing agent for the semiconductor.

The sixth polishing agent for processing semiconductor of the present invention comprises a first solution prepared by dispersing polishing particles in water and a second solution of the above second dispersant used for the polishing agent for the semiconductor.

The first process for preparing a semiconductor device is that polishing is carried out by supplying the first polishing agent for the semiconductor to a polished film which is formed on a semiconductor substrate.

The second process for preparing a semiconductor device is that polishing is carried out by supplying the second polishing agent for the semiconductor to a polished film which is formed on a semiconductor substrate.

BRIEF DESCRIPTION OF THE DRAWINGS

FIG. 1 is a view showing polishing properties obtained when TEG pattern is polished by using the polishing agent for processing semiconductor according to an embodiment of the present invention. In the figure, 1 shows property in the polishing agent for processing semiconductor device of Example 1, and 2 shows property in the polishing agent for processing semiconductor device of Example 2.

FIG. 2 is a distribution view showing particle size distribution of the polishing particles immediately after preparation and that at two days after preparation in comparison by using the polishing agent for processing semiconductor device in examples and comparative examples. In the figure, 13 and h2 show particle size distributions immediately after preparing the polishing agent for processing semiconductor device of Example 13 and Comparative Example 2, respectively. And 13a and h2a show particle size distributions at two days after preparing the polishing agent for processing semiconductor device of Example 13 and comparative Example 2, respectively.

DETAILED DESCRIPTION

Embodiment 1

The polishing agent for processing semiconductor device according to the first embodiment of the present invention comprises a dispersant component comprising a compound having glucose structure, polishing particles and water. A compound having glucose structure is used as a dispersant to disperse polishing particles to water, which enables to control coagulation and sedimentation of polishing particles, and to achieve stable and re-productive polishing properties under a proper dispersing condition.

The polishing agent for processing semiconductor of this embodiment is used by previously mixing the above compound having glucose structure, the polishing particles and water.

Alternatively, the polishing agent is used by mixing a solution (first solution), wherein the polishing particles are dispersed to water, with a dispersant (second solution) comprising a compound having glucose structure and water before or during the polishing, which is used for processing semiconductor.

In this case, a little amount of a dispersant is preferably added to the solution for dispersing the polishing particles from the viewpoint that it accelerates dispersion rate thereof. The dispersant may be used by suitably diluting it with pure water.

The above compound having glucose structure can be used after purification, if required. Examples of the purifying process are a process for removing impure ion by an ion exchange resin, and dust removing by filtration.

As the polishing particles of this embodiment, there is used cerium oxide, silica, silica sol and alumina.

For example, there is used cerium oxide obtained by sintering and pulverizing the cerium compound such as carbonate, sulfonate, or oxalate. It is sintered in the rage of 600 to 2000° C., but under relatively low temperature condition so that crystallinity of the cerium oxide does not become too high. The cerium oxide is pulverized according to jet mill or beads mill.

As the silica, there is used sedimentation silica made from sodium silicate as a raw material, colloidal silica, or fumed silica made from silicon tetra-chloride as a raw material.

There are used primary particles of cerium oxide, silica, silica sol and alumina whose particle size is at most 1 $\mu$m. Polishing with the polishing particles having a larger particle size quickens polishing rate, but easily generates polishing flaw. The primary particles of the polishing particles can be observed by using an electron microscope, and the size of the particle means an average particle size.

There are used cerium oxide, silica and alumina having a high degree of purity. A low degree of purity leads to pollution of the substrate, which causes yield decrease of the device. Particularly, there is used a material whose content of Na, K, Mg, Ca, Ni, Fe, Cr or Al is at most 10 ppm, preferably at most 1 ppm.

Examples of the method for dispersing the polishing particles to water are a propeller stirrer, a homomixer, a homogenizer, an ultrasonic dispersing machine, a ball mill and the like.

The polishing agent for processing semi-conductor of this embodiment may be used after adjusting pH to 7 to 10 by using a water-soluble amine. Examples of the water-soluble amine are mono-ethanol amine, tri-ethanol amine, N,N-diethylethanol amine, N,N-dimethylethanol amine, amino-ethylethanol amine, aqueous ammonia and the like.

As disclosed in Japanese Unexamined Patent Publication No. 340173/1999, the polishing agent can contain a preparation such as hydrogen peroxide aqueous solution or $H_5IO_6$ which has oxidation ability. The above oxidant is mostly used for polishing a metal film.

Embodiment 2

The polishing agent for processing semiconductor device according to the second embodiment of the present invention comprises at least one dispersant component selected from the group consisting of gelatin, taragum, cationic guagum, collagen, dextrin, tragacanth, propylene glycol alginate, cyclodextrin, chitin, hyaluronic acid, carmelose, starch, cyprogum, bee gum, pullalan, laponite, pectin, bentonite, trehalose, casein, saccharose, maltose, fructose, mannose, glucuronic acid, glucosamine, glucosan, cationic cellulose, glucosidase, glucose phenylosazone, hydroxyethylcellulose, chitosan, starch phosphate, soybean lecithin, xanthan gum, tamalind gum, locust bean gum, tamlindsy gum, Arabic gum, cyliumseed gum, caragynan, gelan gum, guar gum, and polyglycerol fatty acid ester. It is possible to use at least two dispersant which are suitably mixed. There is used hydroxyethyl cellulose having a molecular weight of ten thousand to two million. When a molecular weight of the hydroxyethyl cellulose is over two million, viscosity at dissolving in pure water becomes too high, which makes it difficult to be handled. When a molecular weight of the hydroxyethyl cellulose is less than ten thousand, synthesis thereof becomes difficult.

Originally, the above dispersant components in the first and second embodiment have been used as an agent for adjusting viscosity of cosmetics and paint. It was newly adopted as the dispersant for the polishing particles in the polishing agent for processing semiconductor. The dispersant of the second embodiment has the same effect and use as those of the dispersant used in Embodiment 1. Also, it is a preferable material in terms of environmental safeguards.

Next, there is explained action of the above dispersant component in the first and second embodiments.

A polishing particle has many active sites which interact with the active sites in the other polishing particles to cause coagulation of the polishing particles. Therefore, in order to prevent the coagulation of the polishing particles, it is necessary to control the interaction between the polishing particles themselves and effectively coat the active sites in the polishing particles by the dispersant component. Three-dimensional coating by the dispersant component is important for that purpose.

All of the functional groups in the dispersant component need not interact with the polishing particles. But it is necessary to use a dispersant component having chemical structure, wherein the functional groups which selectively interact with the active sites of the polishing particles can be sterically positioned around the polishing particles.

A typical example of a functional group which interacts with the polishing particle is a hydroxyl group. The above dispersants are one of the examples having steric structure, wherein the hydroxyl group can coat the active sites of the polishing particles.

For example, in case of using a compound having glucose structure as a dispersant component, hydroxyl groups in six-membered ring structure become entangled to coat the polishing particles. Further, the six-membered ring structure becomes steric hindrance and controls interaction, namely coagulation of the polishing particles to provide excellent dispersibility.

On the contrary, it can be seen that an excellent polishing property cannot be obtained in case of using conventional ammonium polyacrylate, because sufficient dispersion can not be achieved due to coagulation, which is caused by inadequate steric entanglement of the dispersant with the polishing particles and many remaining active sites of the polishing particles.

Embodiment 3

The process for preparing a semiconductor device according to the third embodiment of the present invention is a process in which the polishing agent for processing semiconductor of the above embodiment 1 or 2 is used.

For example, an insulating film or the like can be used as a film to be polished, which is placed on a semiconductor substrate having a circuit device with aluminum wiring or having a circuit device. The above film to be polished is polished with supplying the polishing agent for processing semiconductor of the above embodiment 1 or 2 to remove unevenness of the film, making the whole surface of the semiconductor substrate flat and smooth. If necessary, second aluminum wiring layer can be formed after completing the polishing and the above process is repeated again to prepare a semiconductor device.

The above semiconductor substrate is placed on a holder with a polishing pad equipped on a fixed board, while the polishing agent for processing semiconductor of the above embodiment is supplied to the above film to be polished, the fixed board or the holder rotating to add pressure to the other to carry out the polishing.

Examples of the polished film are an $SiO_2$ insulating film, a phosphorous-doped Si film, and a non-crystal amorphous Si film. Also, there can be used a tungsten film, a metal film such as Cu film, and BPSG (Boron Phosphorous Silicated Glass) film.

Firstly, as to a process for preparing the $SiO_2$ insulating film, there are plasma CVD method, constant pressure CVD method and the like. The $SiO_2$ insulating film is formed on the substrate by exciting a source such as $SiH_4$ gas or TEOS gas thermally or in a state of plasma.

Poly Si is generally formed in a vertical furnace by using $SiH_4$ gas as a source. In order to improve film evenness and controlling performance of the interface with the under substrate (to decrease naturally oxidized films), there is often used a cold wall single wafer vacuum CVD apparatus. The other commonly used films include the phosphorous-doped Si film and the non-crystal amorphous Si film.

In general, the metal film is formed according to sputtering method or CVD method. According to the sputtering method, Ar gas is introduced to a high vacuum chamber which is equipped with a target having the same composition as that of the metal film, and DC power is induced to the target. Collision of Ar ions to the target sputters out metal, and the metal accumulates to form a thin film on the substrate surface. In the CVD method, source gas having a metal composition is reduced to form a thin film. There are well-known a reduction process of $H_2$ and $SiH_4$ in $WF_6$ which forms a tungsten film. Also, plating to form a Cu film is paid attention to. Vapor deposition is an across-the-board method for a wafer process.

EXAMPLE 1

There were mixed 0.5 kg of cerium oxide whose primary particles size is 0.2 $\mu$m, 40 g of xanthan gum and 10 kg of pure water. Then, it was dispersed by using an ultrasonic homogenizer for an hour. Further, thereto was added 30 kg of pure water and the mixture was stirred with a propeller to prepare a polishing agent for processing semiconductor. By using a single wafer polishing agent for processing semiconductor. By using a single wafer polishing apparatus equipped with a polishing pad made of foamed polyurethane, an $SiO_2$ insulating film formed on a semiconductor substrate according to the CVD method was polished. It was polished with pressing pressure of 35 kPa, fixed plate rotation speed of 50 rpm and carrier rotation speed of 49 rpm, while the above polishing agent was dropped at flow rate of 150 ml/min. In this case, polishing ratio was about 350 nm/mm.

FIG. 1 shows a polishing property in case of polishing TEG (Test Element Group) pattern having difference of 1000 nm under the above polishing conditions. The vertical axis indicates remaining difference (Å), while the horizontal axis indicates edge length of the TEG. In the figure, numeral 1 indicates the polishing property of the present invention, exhibiting excellent difference reduction performance of this example.

After the polishing was finished and the pattern was washed with pure water, spin-dried and observed with a flaw finder or SEM, no apparent polishing flaw was observed. Thus, the polishing was excellently performed.

EXAMPLE 2

There were mixed 2 kg of silica polishing particles whose primary particles size is 0.08 $\mu$m, 60 g of arabic gum and 40 kg of pure water. The mixture was stirred with a propeller to prepare a polishing agent for processing semiconductor. As an $SiO_2$ insulating film was prepared according to plasma CVD method and polished in the same manner as in Example 1, no apparent polishing flaw was observed. Thus, the polishing was excellently performed. Relationship between pattern size and remaining difference was measured in the same manner as in Example 1. Numeral 2 in the figure shows a polishing property of this example.

EXAMPLE 3

There were prepared 1.2 kg of silica polishing particles whose primary particles size is 0.08 $\mu$m, 1 kg of fructose, 100 g of hydrogen peroxide aqueous solution and 40 kg of pure water. The mixture was stirred with a propeller to prepare a polishing agent for processing semiconductor. As the polishing agent was used to polish a W-electrode film, no apparent polishing flaw was found. Thus, it was possible to perform excellent polishing with controlling generation of erosion and dishing.

EXAMPLE 4

There were prepared 0.5 kg of cerium oxide whose primary particles size is 0.1 μm, 400 g of hydroxyethylcellulose having a molecular weight of 9×10⁴ and 40 kg of pure water. The mixture was stirred with a propeller at 60° C. to prepare a polishing agent for processing semiconductor. As an $SiO_2$ insulating film prepared by plasma CVD method was polished in the same manner as in Example 1 and the insulating film of the substrate was observed through a microscope. No apparent polishing flaw was found, and it was possible to perform excellent and fast polishing.

EXAMPLE 5

There were prepared 0.5 kg of silica polishing particles whose primary particles size is 0.05 μm, 1 kg of trehalose and 40 kg of pure water. The mixture was stirred with a propeller to prepare a polishing agent for processing semiconductor. As an $SiO_2$ insulating film prepared by plasma CVD method was polished in the same manner as in Example 1 and the insulating film of the substrate was observed through a microscope. No apparent polishing flaw was found, and it was possible to perform excellent and fast polishing.

EXAMPLE 6

There were prepared 0.5 kg of cerium oxide whose primary particles size is 0.2 μm, 500 g of cationic cellulose and 40 kg of pure water. The mixture was stirred with a propeller at 60° C. to prepare a polishing agent for processing semiconductor. As an $SiO_2$ insulating film prepared by plasma CVD method was polished in the same manner as in Example 1 and the insulating film of the substrate was observed through a microscope. No apparent polishing flaw was found, and it was possible to perform excellent and fast polishing.

EXAMPLE 7

There were prepared 0.5 kg of cerium oxide whose primary particles size is (0.2 μm, 500 g of bee gum and 40 kg of pure water. The mixture was stirred with a propeller to prepare a polishing agent for processing semiconductor. As an $SiO_2$ insulating film prepared by plasma CVD method was polished in the same manner as in Example 1 and the insulating film of the substrate was observed through a microscope. No apparent polishing flaw was found and it was possible to perform excellent and fast polishing.

EXAMPLE 8

There were prepared 2 kg of silica polishing particles whose primary particles size is 0.06 μm, 60 g of laponite and 40 kg of pure water. The mixture was stirred with a propeller to prepare a polishing agent for processing semiconductor. As an $SiO_2$ insulating film prepared by plasma CVD method was polished in the same manner as in Example 1 and the insulating film of the substrate was observed through a microscope. No apparent polishing flaw was found, and the polishing was excellently performed.

EXAMPLE 9

There were prepared 2 kg of silica polishing particles whose primary particles size is 0.05 μm, 500 g of gelatin and 40 kg of pure water. The mixture was stirred with a propeller to prepare a polishing agent for processing semiconductor. As an $SiO_2$ insulating film prepared by plasma CVD method was polished in the same manner as in Example 1 and the insulating film of the substrate was observed through a microscope. No apparent polishing flaw was found, and the polishing was performed excellently.

EXAMPLE 10

There were prepared 2 kg of cerium oxide whose primary particles size is 0.1 μm, 2 kg of pectin and 40 kg of pure water. The mixture was stirred with a propeller to prepare a polishing agent for processing semiconductor. As an $SiO_2$ insulating film prepared by plasma CVD method was polished in the same manner as in Example 1, and the insulating film of the substrate was observed through a microscope. No apparent polishing flaw was found, and the polishing was excellently performed.

EXAMPLE 11

There were prepared 2 kg of cerium oxide whose primary particles size is 0.03 μm, 4 kg of pullulan and 40 kg of pure water. The mixture was stirred with a propeller to prepare a polishing agent for processing semiconductor. As an $SiO_2$ insulating film prepared by plasma CVD method was polished in the same manner as in Example 1, and the insulating film of the substrate was observed through a microscope. No apparent polishing flaw was found, and the polishing was excellently performed.

EXAMPLE 12

There were prepared 2 kg of cerium oxide whose primary particles size is 0.03 μm, 700 g of carrageenan and 40 kg of pure water. The mixture was stirred with a propeller to prepare a polishing agent for processing semiconductor. As an $SiO_2$ insulating film prepared by plasma CVD method was polished in the same manner as in Example 1, and the insulating film of the substrate was observed through a microscope. No apparent polishing flaw was found, and the polishing was excellently performed.

The second dispersant for processing semiconductor of the present invention comprises a dispersant component and water, wherein the dispersant component is formed by at least one selected from the group consisting of gelatin, taragum, cationic guar gum, collagen, dextrin, tragacanth, propylene glycol alginate, cyclodextrin, chitin, hyaluronic acid, carmelose, starch, cyprogum, bee gum, pullulan, laponite, pectin, bentonite, trehalose, casein, saccharose, maltose, fructose, mannose, glucuronic acid, glucosamine, glucosan, cationic cellulose, glucosidase, glucose phenylosazone, hydroxyethylcellulose, chitosan, starch phosphate, soybean lecithin, xanthan gum, tamalind gum, locust bean gum, tamalindsy gum, Arabic gum, cyliumseed gum, caragynan, agar, gelan gum, guar gum and polyglycerol fatty acid ester. According to this, there is effect that the agent is excellent in dispersibility and is preferable in view of environmental protection.

EXAMPLE 13

There were prepared 2 kg of cerium oxide whose primary particles size is 0.03 μm, 500 g of gelatin and 20 kg of pure water. The mixture was stirred with a propeller to prepare the first solution. There were separately prepared 1 kg of gelatin and 20 kg of pure water to prepare the second solution, which is a dispersant used for a polishing agent for processing semiconductor. The above first solution was supplied through the polishing particle nozzle while the above second solution was supplied through the dispersant nozzle to mix them together before polishing. As an SiO$_2$ insulating film prepared by plasma CVD method was polished in the same manner as in Example 1, and the insulating film of the substrate was observed through a microscope. No apparent polishing flaw was found, and the polishing was excellently performed.

In this way, polishing property could be excellent and there was effect that storing stability was improved in the polishing agent for semiconductor, even when the first solution containing polishing particles and the second solution of dispersant used for polishing agent for semiconductor are separately prepared and mixed together before polishing.

It was made possible to improve storing stability of the polishing agent for semiconductor, because the polishing particles are coagulated against time. Namely, re-dispersion becomes difficult if they coagulate at polishing in a state that a pre-determined dispersant is already mixed, while re-dispersion is easy and coagulation can be broken by stirring if the particles coagulate in the solution containing no or a little dispersant. As a result, a long-term storing becomes easier, if the above first and second solution are separated and mixed immediately before polishing.

Comparative Example 1

There were prepared 2 kg of cerium oxide whose primary particles size is 0.03 μm, 1.0 kg of ammonium salt of polyacrylate and 20 kg of pure water. The mixture was stirred with a propeller to prepare a polishing agent for processing semiconductor. As an SiO$_2$ insulating film prepared by plasma CVD method was polished in the same manner as in Example 1, polishing flaw was generated. Thus, it was impossible to obtain excellent polishing property due to insufficient dispersion when the conventionally known ammonium salt polyacrylate is only used.

Comparative Example 2

There were prepared 2 kg of cerium oxide whose primary particles size is 0.03 μm, 50 g of ammonium salt of polyacrylate and 20 kg of pure water. The mixture was stirred with a propeller to prepare a solution containing polishing particles. There were separately prepared 11.2 kg of ammonium salt of polyacrylate and 20 kg of pure water to prepare a polishing agent for processing semiconductor. Then, the solution containing ceria is mixed with the dispersant before polishing. As an SiO$_2$ insulating film prepared by plasma CVD method was polished in the same manner as in Example 1, polishing flaw was generated. Thus, it was impossible to obtain excellent polishing property due to insufficient dispersion, when the conventionally known ammonium salt polyacrylate is only used.

FIG. 2 is a distribution view showing particle size distributions of the polishing particles immediately after preparation and that at two days after preparation in comparison by using the polishing agent for semiconductor in the above Example 13 and Comparative Example 2. In the figure, numeral 13 indicates particle size distribution of the polishing agent right after preparation of the polishing agent in Example 13. Numeral 13a indicates that at two days after preparation in the Example 13. Numeral h2 indicates particle size distribution of the polishing agent immediately after preparation of the polishing agent in Comparative Example 2. Numeral h2a indicates that at two days after the preparation in Comparative Example 2.

As is clear from the figure, particle size distribution was stable in the polishing agent for semiconductor of Example 13. However, dispersion was insufficient and coagulation easily occurred in the polishing agent of Comparative Example 2. In this way, the dispersant of the present invention is capable of providing excellent dispersion of the polishing particles, and therefore, the polishing property is improved.

As well as the compound with glucose structure, protein, mucopolysaccharide mucilage and the like can also provide excellent polishing property.

The first dispersant for processing semiconductor of the present invention comprises a dispersant component formed by a compound having glucose structure and water. According to this, there is effect that the agent is excellent in dispersibility and is preferable in view of environmental protection.

The second dispersant for processing semiconductor of the present invention comprises a dispersant component and water, wherein the dispersant component is formed by at least one selected from the group consisting of gelatin, taragum, cationic guagum, collagen, dextrin, traganth, propylene glycol alginate, cyclodextrin, chitin, hyaluronic acid, traganth gum, carmelose, starch, cyprogum, beagum, purlan, laponite, pectin, bentonite, trehalose, casein, saccharose, maltose, fructose, mannose, glucuronic acid, glucosamine, glucosan, cationic cellulose, glucosidase, glucosephenylosazine, hydroxyethylcellulose, chitosan, starch phosphate, soybean lecithin, xanthane gum, tamalind gum, locastbean gum, tamalindsy gum, Arabic gum, cyliumseed gum, caragynan, agar, gelan gum, guagum, polyglycerol fatty acid ester, and natrozole. According to this, there is effect that the agent is excellent in dispersibility and is preferable in view of environmental protection.

The first polishing agent for processing semiconductor device of the present invention comprises the above first dispersant and polishing particles. According to this, there is an effect that reproductive polishing property can be stably obtained in a proper dispersing condition and generation of polishing flaw is prevented.

The second polishing agent for processing semiconductor device of the present invention comprises the above second dispersant and polishing particles. According to this, there is an effect that reproductive polishing property can be stably obtained in a proper dispersing condition, and generation of polishing flaw is prevented.

The third polishing agent for processing semiconductor device is that in the above first polishing agent, the polishing particles is at least one selected from the group consisting of cerium oxide, silica, silica sol and alumina whose primary particles size is at most 1 μm. According to this, there is an effect that re-productive polishing property can be stably obtained in a proper dispersing condition while generation of polishing flaw is prevented.

The fourth polishing agent for processing semiconductor device is that in the above second polishing agent, the polishing particles is at least one selected from the group consisting of cerium oxide, silica, silica sol and alumina whose primary particles size is at most 1 μm. According to this, there is an effect that re-productive polishing property can be stably obtained in a proper dispersing condition while generation of polishing flaw is prevented.

The fifth polishing agent for processing semiconductor device comprises a first solution prepared by dispersing polishing particles in water and a second solution of the above first dispersant used for the polishing agent for semiconductor. According to this, there is an effect that the polishing agent is excellent in conservation.

The sixth polishing agent for processing semiconductor device comprises a first solution prepared by dispersing polishing particles in water and a second solution of the above second dispersant used for the polishing agent for the semiconductor. According to this, there is an effect that the polishing agent is excellent in conservation.

The first process for preparing a semiconductor device is a process in which polishing is carried out with supplying the first polishing agent for semiconductor to a film to be polished which is formed on a semiconductor substrate. According to this, there is an effect that generation of polishing flaw is prevented.

The second process for preparing a semiconductor device is a process in which polishing is carried out with supplying the second polishing agent for semiconductor to a film to be polished which is formed on a semiconductor substrate. According to this, there is an effect that generation of polishing flaw is prevented.

What is claimed is:

1. A dispersant used for a polishing agent for processing semiconductor comprising a dispersant component and water, wherein the polishing dispersant component is at least one selected from the group consisting of gelatin, taragum, cationic guar gum, collagen, dextrin, tragacanth, propylene glycol alginate, cyclodextrin, chitin, hyaluronic acid, carmelose, starch, cyprogum, bee gum, pullulan, laponite, pectin, bentonite, trehalose, casein, saccharose, maltose, fructose, mannose, glucuronic acid, glucosamine, glucosan, cationic cellulose, glucosidase, glucose phenylosazone, hydroxyethylcellulose, chitosan, starch phosphate, soybean lecithin, xanthane gum, tamalind gum, locust bean gum, tamalindsy gum, Arabic gum, cyliumseed gum, caragynan, gelan gum, guar gum and polyglycerol fatty acid ester.

2. A polishing agent for processing semiconductor comprising the dispersant of claim 1 and polishing particles.

3. A polishing agent for processing semiconductor according to claim 2, wherein the polishing particles is at least one selected form the group consisting of cerium oxide, silica, silica sol and alumina, whose particle size of the primary particles is at most 1 $\mu$m.

4. A polishing agent for processing semiconductor comprising a first solution prepared by dispersing polishing particles in water and a second solution of the dispersant of claim 1.

5. A process for preparing a semiconductor device, wherein polishing is carried out by supplying the polishing agent for the semiconductor of claim 2 to a polished film which is formed on a semiconductor substrate.

6. A polishing agent according to claim 3 wherein the dispersant component is at least one selected from the group consisting of xanthan gum, arabic gum, hydroxyethylcellulose, cationic cellulose, bee gum, gelatin, pectin, pullulan and carrageenan.

7. A polishing agent according to claim 3 wherein the dispersant is selected from the group consisting of fructose and trehalose.

8. A polishing agent according to claim 3 wherein the dispersant is laponite.

* * * * *